(12) United States Patent
Tashiro et al.

(10) Patent No.: US 8,161,608 B2
(45) Date of Patent: Apr. 24, 2012

(54) METHOD OF MANUFACTURING QUARTZ-CRYSTAL RESONATOR

(75) Inventors: Akihiko Tashiro, Sayama (JP); Hiroyuki Sasaki, Sayama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 194 days.

(21) Appl. No.: 12/655,290

(22) Filed: Dec. 28, 2009

(65) Prior Publication Data
US 2010/0192340 A1 Aug. 5, 2010

(30) Foreign Application Priority Data
Jan. 30, 2009 (JP) .................................. 2009-20263

(51) Int. Cl.
*H04R 17/00* (2006.01)
(52) U.S. Cl. ............. 29/25.35; 29/594; 29/846; 29/847; 216/13; 216/41; 216/49; 216/83
(58) Field of Classification Search ................ 29/25.35, 29/594, 846, 847; 216/13, 41, 49, 83, 96–97
See application file for complete search history.

(56) References Cited

U.S. PATENT DOCUMENTS

| | | | |
|---|---|---|---|
| 7,485,238 B2 * | 2/2009 | Satoh et al. ..................... 216/41 |
| 7,690,095 B2 * | 4/2010 | Takahashi ..................... 29/25.35 |
| 7,947,187 B2 * | 5/2011 | Saito ............................... 216/11 |
| 2007/0074394 A1 * | 4/2007 | Miyata et al. ................ 29/890.1 |
| 2009/0096329 A1 * | 4/2009 | Ono et al. ..................... 310/348 |
| 2010/0141100 A1 * | 6/2010 | Takahashi et al. ............ 310/365 |

FOREIGN PATENT DOCUMENTS

| JP | 2007-142526 | 6/2007 |
|---|---|---|
| JP | 2008-92505 | 4/2008 |

* cited by examiner

*Primary Examiner* — Derris Banks
*Assistant Examiner* — Azm Parvez
(74) *Attorney, Agent, or Firm* — Jordan and Hamburg LLP

(57) ABSTRACT

To provide a method of manufacturing a quartz-crystal resonator, in which without adding new processes, a desired quartz-crystal piece can be obtained from a quartz-crystal wafer by etching and electrodes can be provided without restraint. When a quartz-crystal piece 10 is formed, etching masks 6 having dummy regions 44, 48 that are provided at two positions corresponding to corner portions on a +X side of the quartz-crystal piece 10 and extend toward a +X axis direction of a wafer W are formed, and when the quartz-crystal piece 10 is formed, etching in groove portions 7 at positions corresponding to the dummy regions 44, 48 is delayed. Accordingly, it is possible to form the quartz-crystal piece 10 without chipped portions at the corner portions in a state where the quartz-crystal piece 10 and the wafer W are connected to and supported by a connection support portion 11.

4 Claims, 14 Drawing Sheets

Fig. 2
(a)
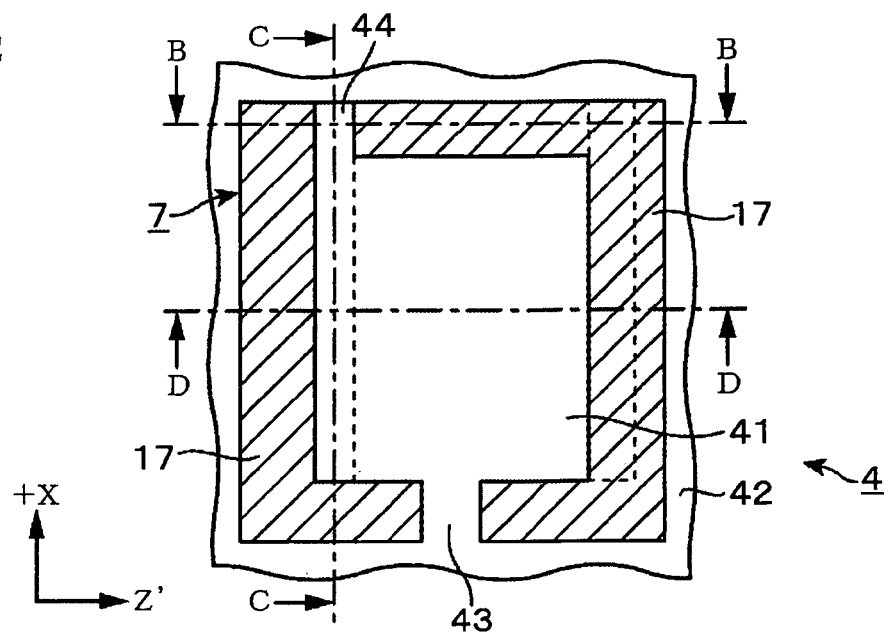
(b)
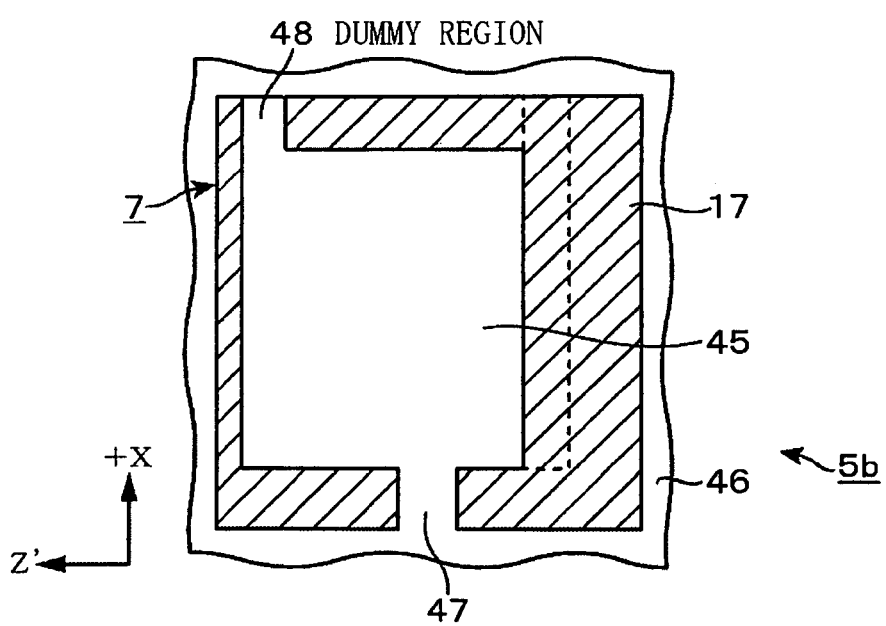
(c)
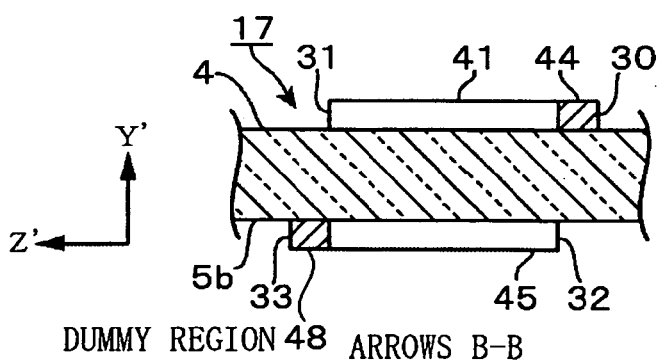

Fig. 4
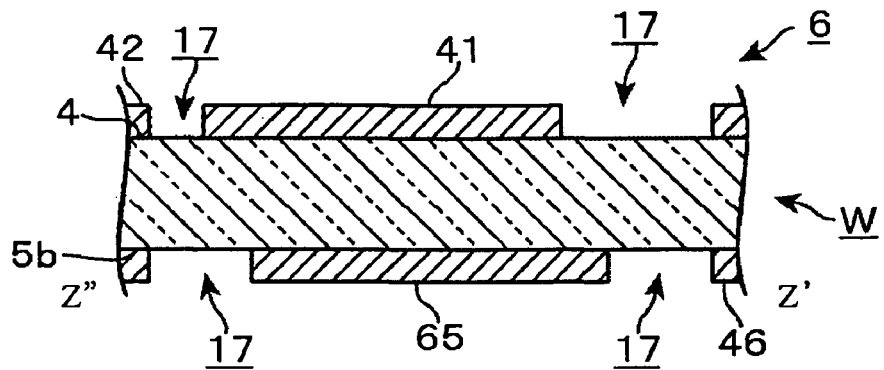
(a)
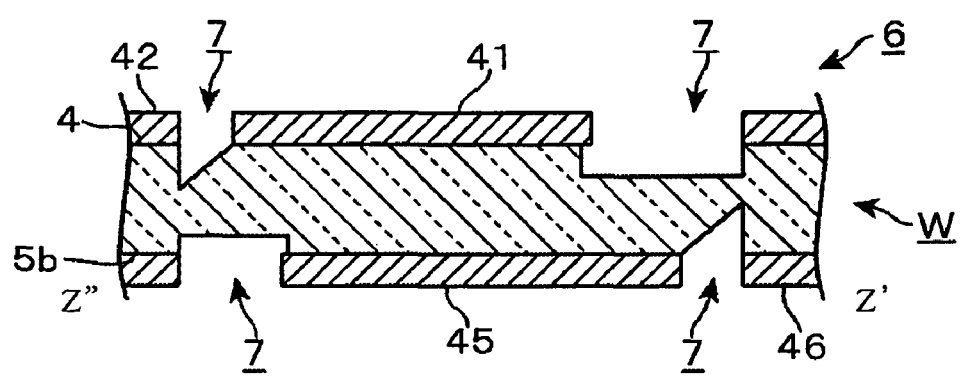
(b)
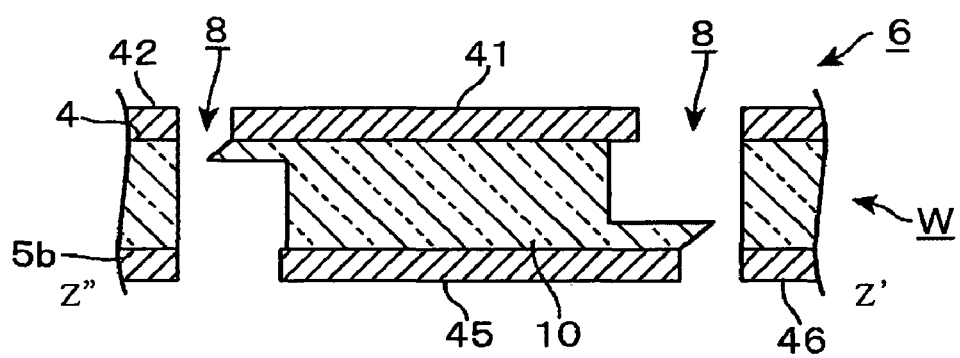
(c)
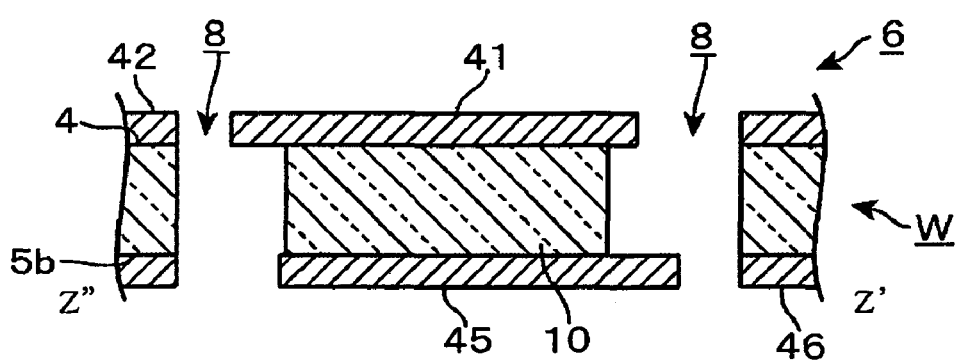
(d)

Fig. 5
(a)
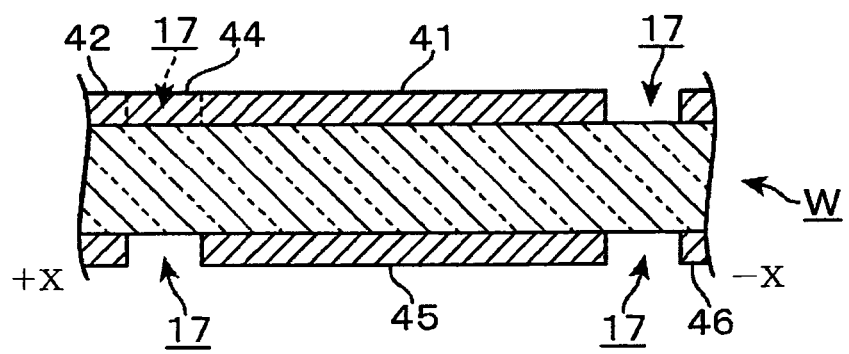
(b)
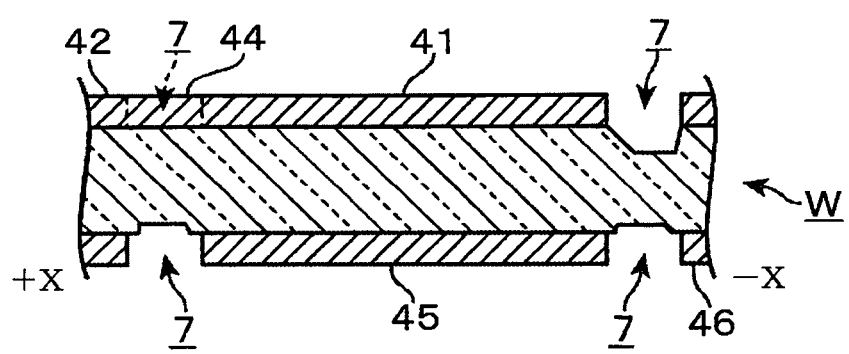
(c)
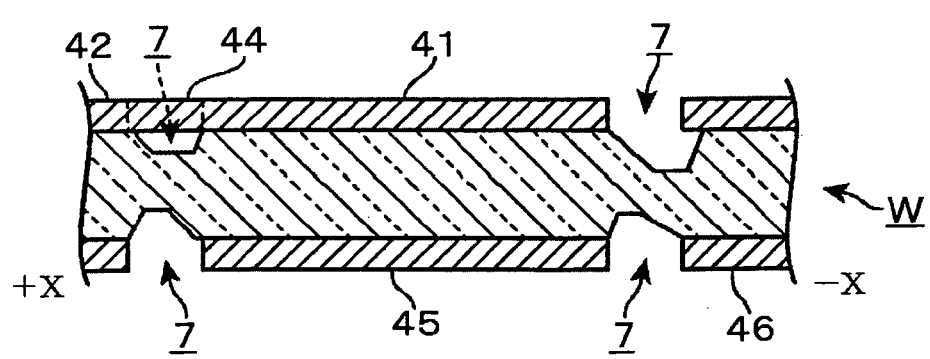

Fig. 6
(a)
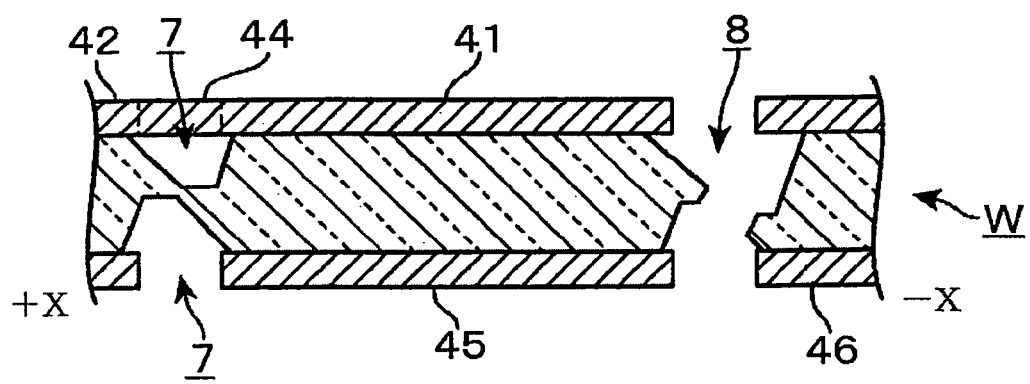
(b)
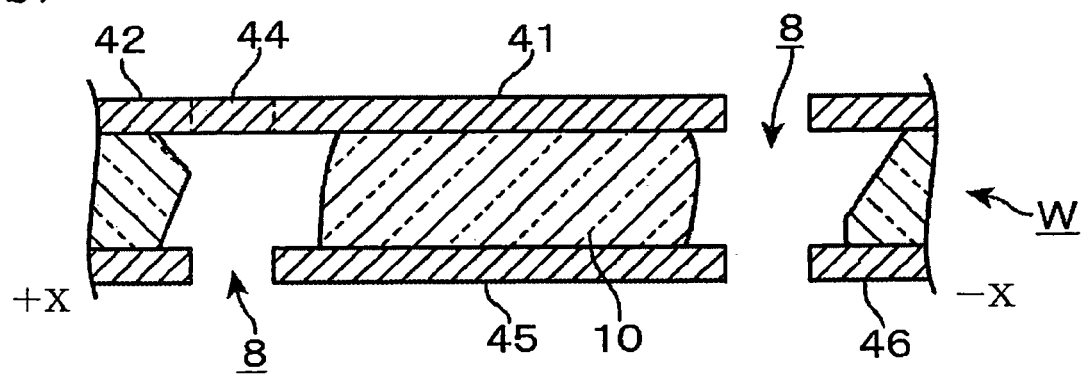

Fig. 9
(a)
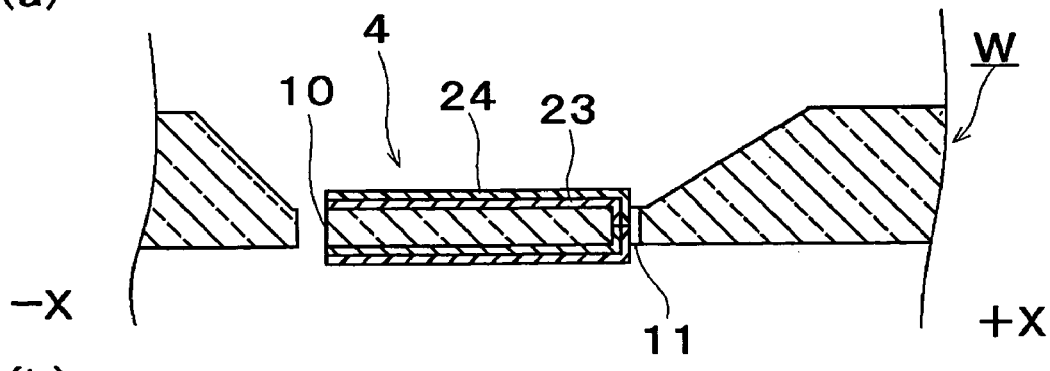
(b)
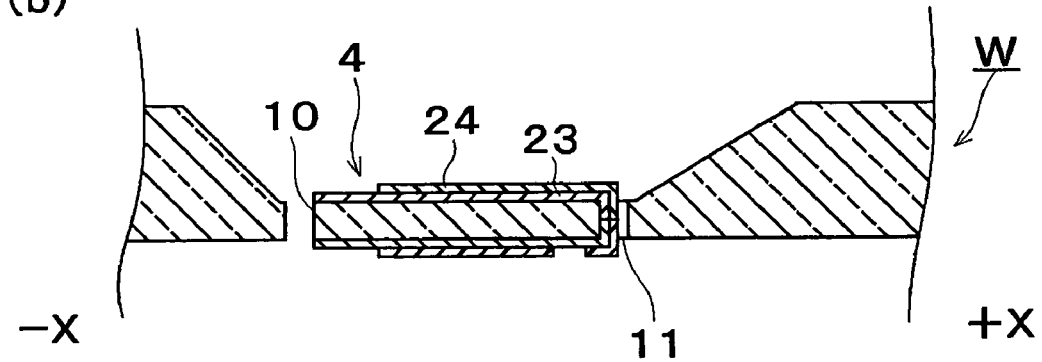
(c)
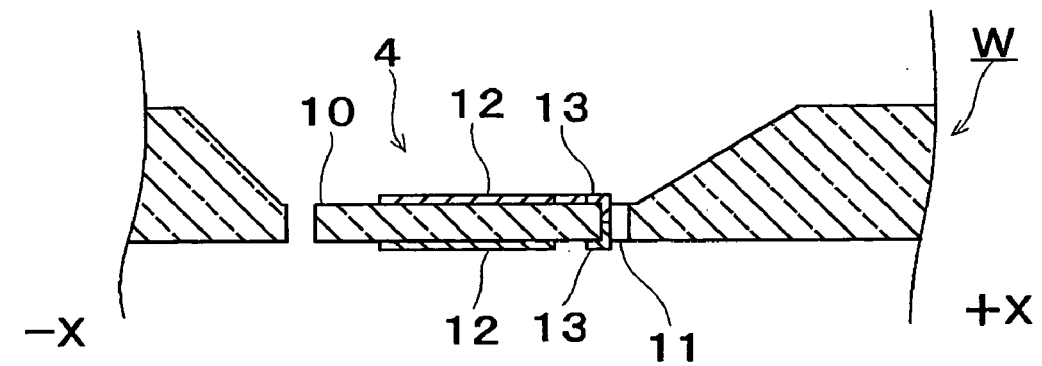
(d)
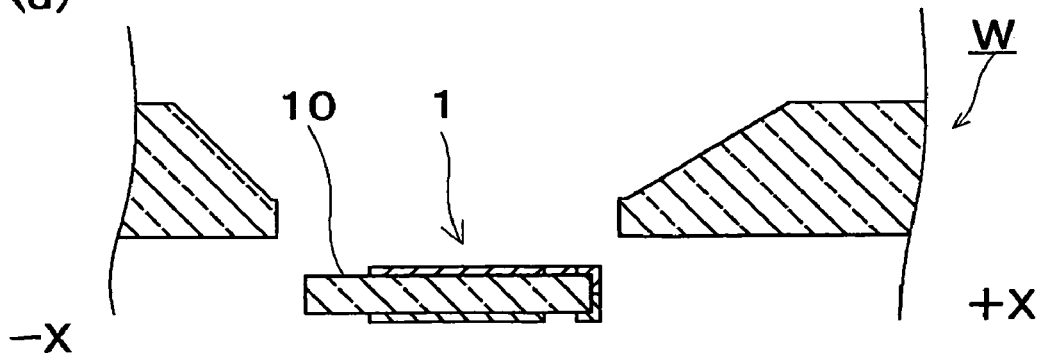

Fig. 10
(a)
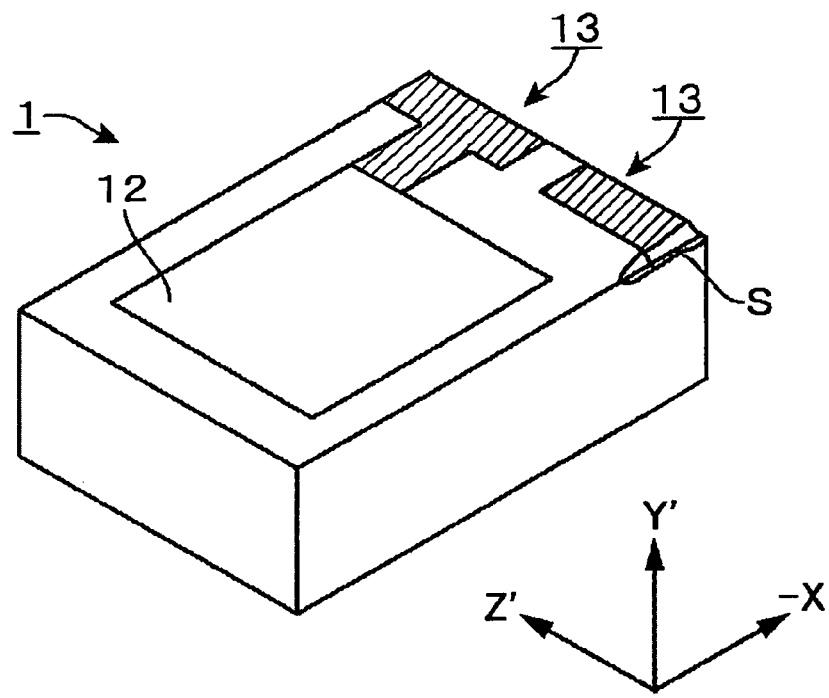
(b)
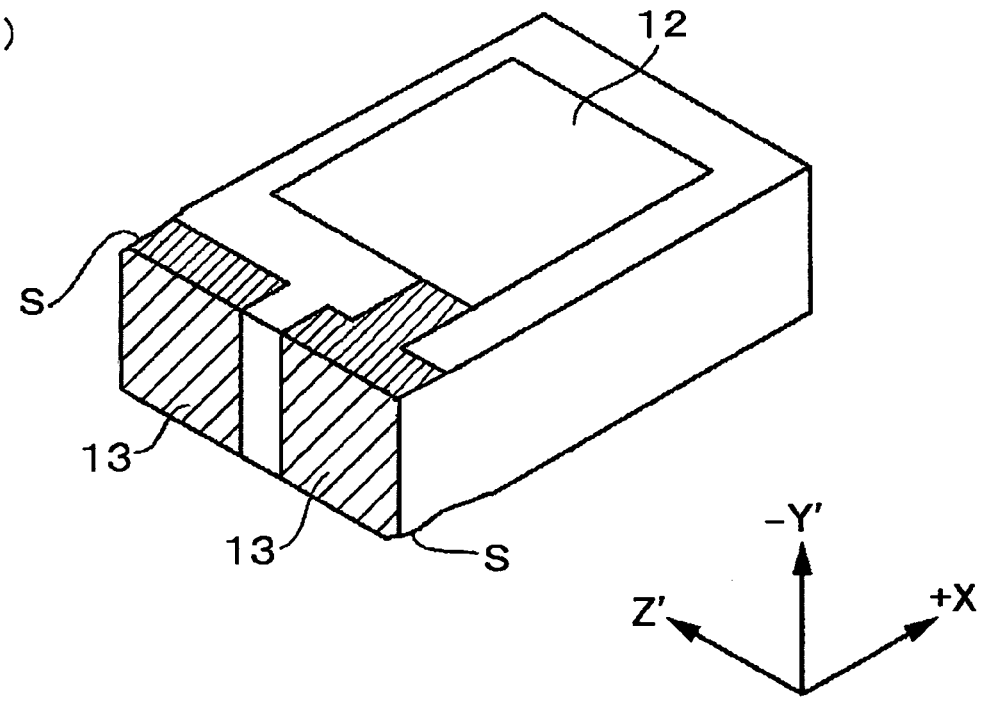

Fig. 11
(a)
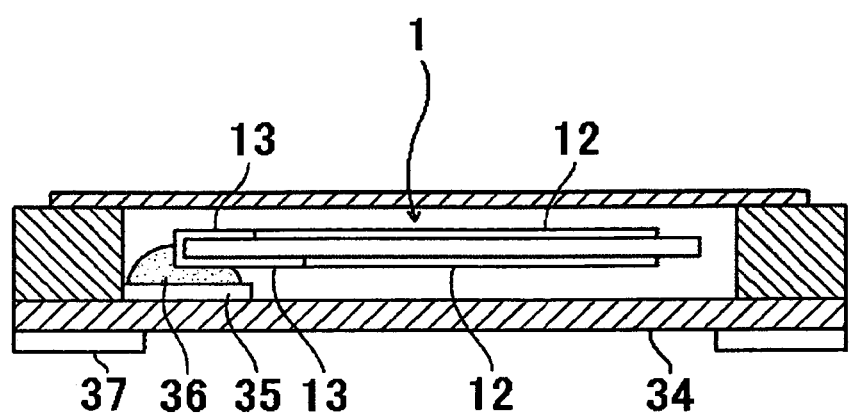
(b)
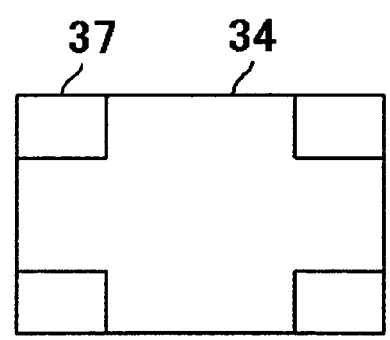

Fig. 12
(a)
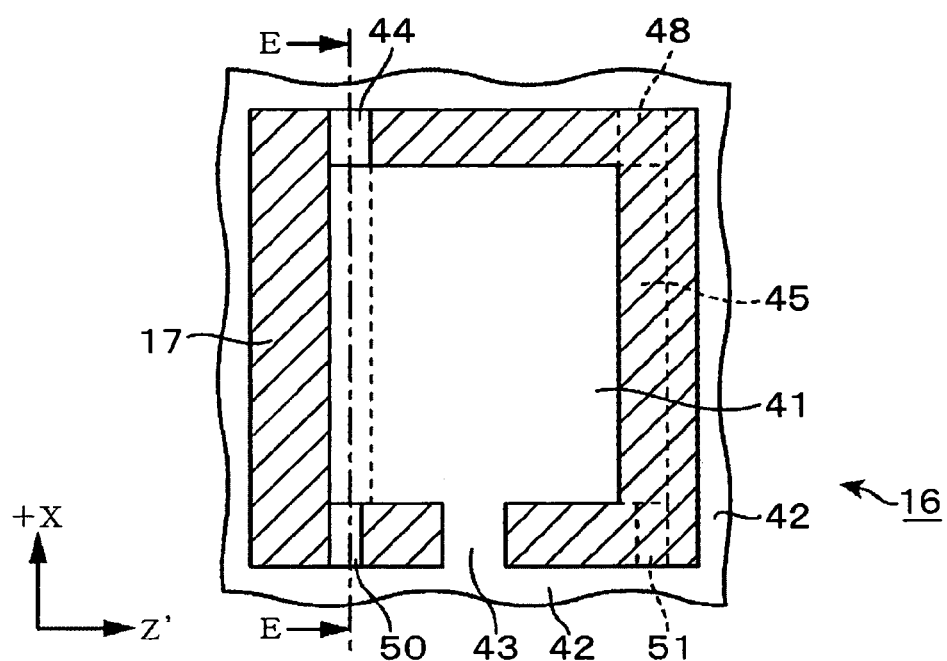
(b)
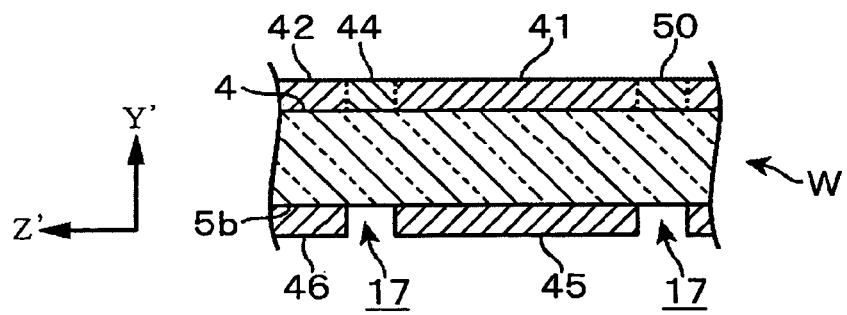
ARROWS E-E

Fig. 13
(a)
PRIOR ART
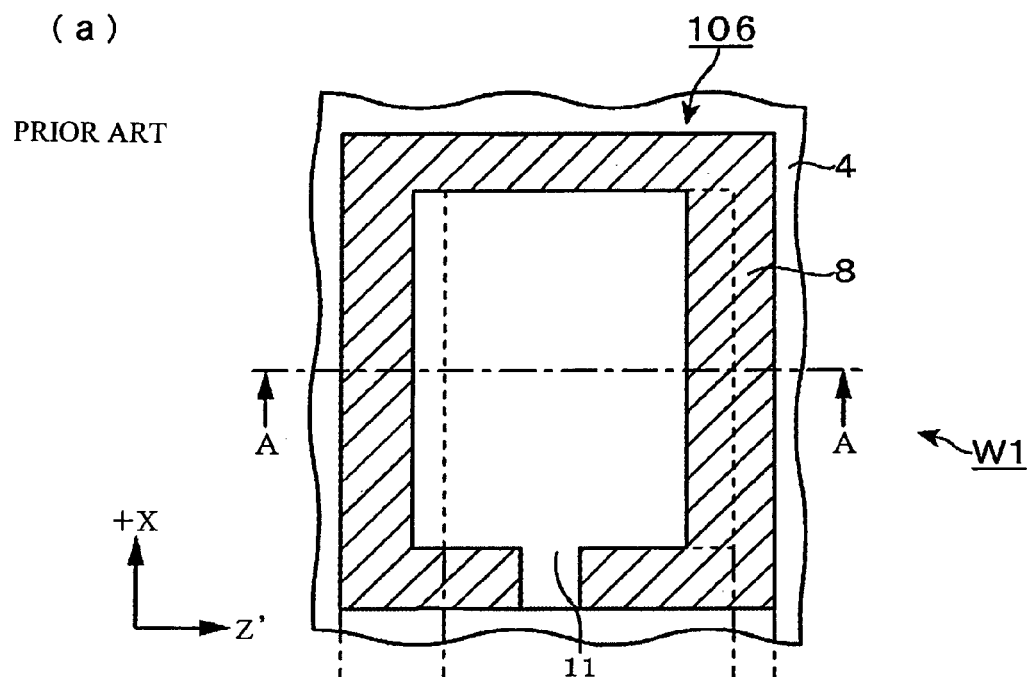
(b)
PRIOR ART
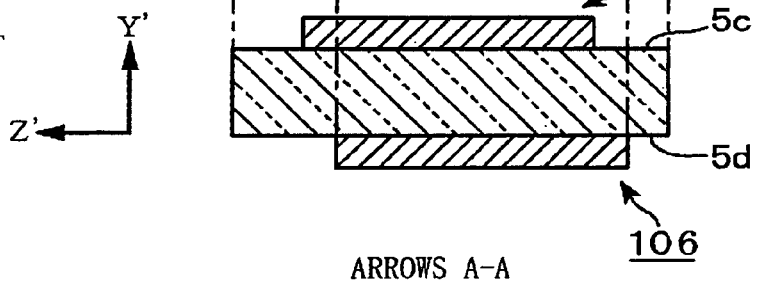
ARROWS A-A

Fig. 14
(a) PRIOR ART
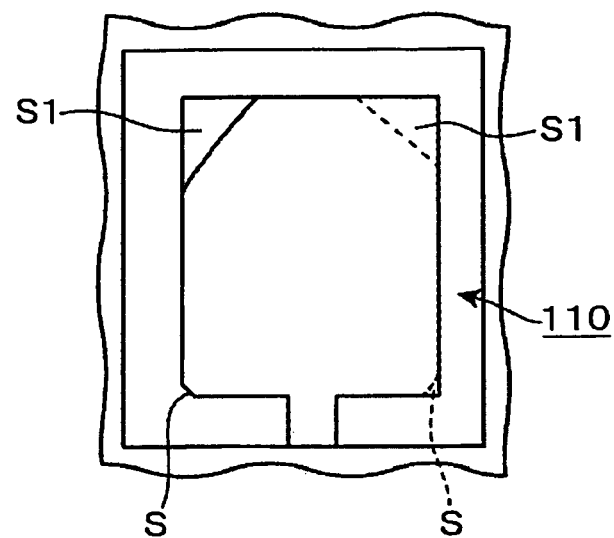
(b) PRIOR ART
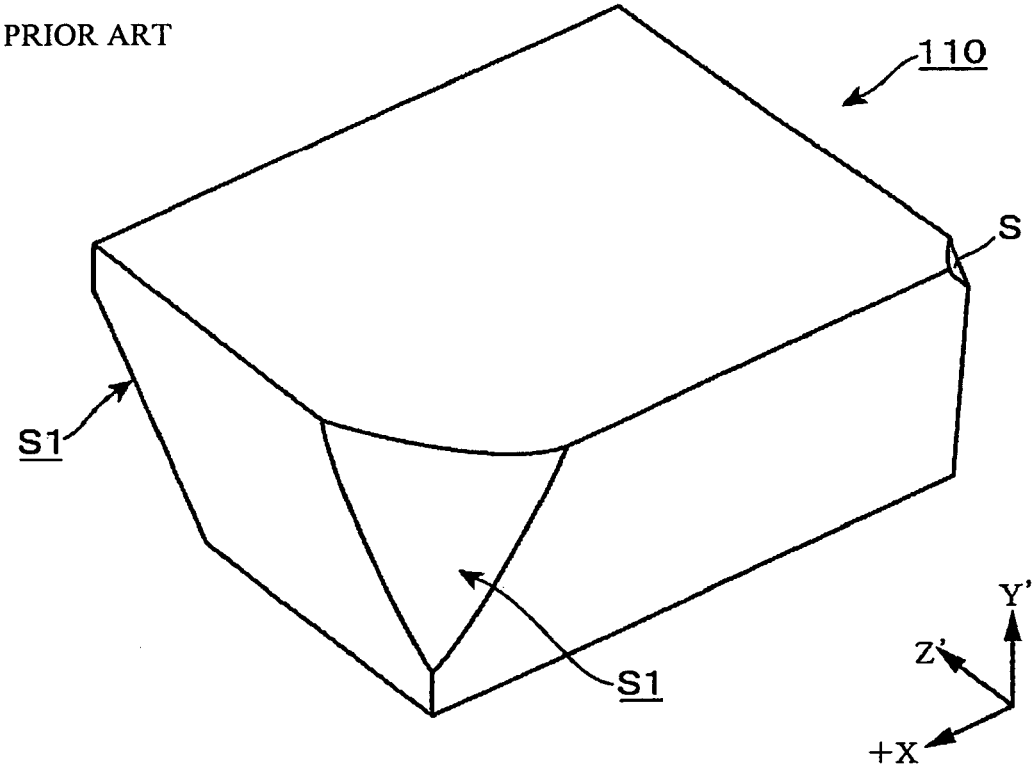

METHOD OF MANUFACTURING QUARTZ-CRYSTAL RESONATOR

BACKGROUND OF THE INVENTION

1. Field of the Invention

The present invention relates to a technique to manufacture a quartz-crystal resonator using, for example, an AT cut quartz-crystal piece having an anisotropy.

2. Description of the Related Art

As a reference source of frequency and a reference source of time in an oscillator or the like, which is one of electronic components, a quartz-crystal resonator is used. A quartz-crystal piece of the quartz-crystal resonator is formed in a predetermined shape, which is, for example, a rectangular parallelepiped shape, from a wafer of a quartz-crystal that is AT cut, for example, and a large number of the quartz-crystal pieces are formed from the single wafer.

As one example of a method of forming the above quartz-crystal piece, as illustrated in FIG. 13(a) and FIG. 13(b), for example, there is a method in which etching masks 106 are formed on a front surface 5c and a rear surface 5d of a quartz-crystal wafer W1, and by etching the quartz-crystal wafer W1, a desired quartz-crystal piece 110 corresponding to shapes of the etching masks 106 is obtained. When the quartz-crystal piece is formed by etching, quartz-crystals at portions under the etching masks 106 are etched by side etching. Thus, the etching masks 106 have sizes and the shapes thereof determined by considering etching amounts (amounts in which quartz-crystals are etched) by side etching.

However, a quartz-crystal has an anisotropy and has a characteristic that etching proceeds aggressively on one side in a specific crystal axis direction, and in the AT cut quartz-crystal, due to an anisotropy thereof, etching proceeds aggressively on a +X side in an X axis direction being a crystal axis in particular. Thus, when the quartz-crystal piece 110 is tried to be formed by using the etching masks 106, the quartz-crystal piece 110 in a deformed shape having chipped portions S1 at corners on the +X side is formed as illustrated in FIG. 14(a) and FIG. 14(b), and therefore there is a case that a desired quartz-crystal piece cannot be obtained.

When the shape of the quartz-crystal piece is deformed, a characteristic of the quartz-crystal resonator is deteriorated in forming excitation electrodes and lead electrodes on the quartz-crystal piece, and thus it is not preferable that the corners of the quartz-crystal piece are side etched. When the quartz-crystal piece is made small in particular, a difference in sizes between the quartz-crystal piece and the excitation electrodes is made small. Thus, if the chipped portions exist in the quartz-crystal piece, it can be considered that the excitation electrodes are formed at the chipped portions. Then, when the excitation electrodes are formed at the chipped portions, there is a concern that an effect on the characteristic of the quartz-crystal resonator is made large.

On the other hand, in Patent Document 1, there is disclosed a method of manufacturing a quartz-crystal resonator, in which support portions connecting a quartz-crystal piece to a quartz-crystal substrate and supporting the quartz-crystal piece and the quartz-crystal substrate are provided at both corner portions on a −X side of the quartz-crystal piece to be formed, and the support portions prevent chipped portions from being formed at corners on the −X side of the quartz-crystal piece. Further in Patent Document 2, there is disclosed a method of manufacturing a quartz-crystal resonator, in which support portions connecting a quartz-crystal piece to a quartz-crystal substrate and supporting the quartz-crystal piece and the quartz-crystal substrate are provided at both corner portions on a +X side of the quartz-crystal piece to be formed, and the support portions prevent chipped portions from being formed at corners on the +X side of the quartz-crystal piece.

In the method in Patent Document 1, connection support portions are not formed on a +X side, and thus side etching cannot be prevented when the quartz-crystal piece is formed from an AT cut quartz-crystal wafer. In the method in Patent Document 2, when the quartz-crystal piece is formed from an AT cut quartz-crystal wafer, etching in the corner portions on the +X side is prevented by connection support portions, and therefore generation of side etching can be prevented. However, on a connection support portion side, a shape of the quartz-crystal piece is deformed when the quartz-crystal piece is cut, and therefore it is general that lead electrodes are not formed on the connection support portion side. In the method in Patent Document 1, lead electrodes are to be definitely formed on the +X side, so that there is a difficult point that a layout of the electrodes in the quartz-crystal resonator cannot be performed without restraint.

Accordingly, since the method of manufacturing the quartz-crystal resonator, which is illustrated in FIG. 13(a) and FIG. 13(b), is more advantageous to manufacture with regard to a point on which it is possible to select without restraint where on the quartz-crystal piece a connection support portion is formed, a method of manufacturing a quartz-crystal resonator, in which a connection support portion is formed at an arbitrary place and a desired quartz-crystal piece can be obtained by etching, is required.

[Patent Document 1] Japanese Patent Application Laid-open No. 2008-92505 (paragraphs 0016, 0018)

[Patent Document 2] Japanese Patent Application Laid-open No. 2007-142526 (paragraphs 0015, 0019)

SUMMARY OF THE INVENTION

The present invention has been made under such circumstances, and an object thereof is to provide a method of manufacturing a quartz-crystal resonator, in which without adding new processes, a desired quartz-crystal piece can be obtained from a quartz-crystal wafer by etching and electrodes can be provided without restraint.

A method of manufacturing a quartz-crystal resonator of the present invention, which includes using an AT cut quartz-crystal substrate to obtain a quartz-crystal piece in a substantially rectangular shape by etching in a state where the quartz-crystal piece is supported at a residual portion of the quartz-crystal substrate, the method including:

forming metal films and resist films on a front surface being a surface on a +Y' side and a rear surface of the quartz-crystal substrate;

performing exposure and development processes for the resist films and forming resist masks that include: mask portions corresponding to quartz-crystal piece regions to obtain the quartz-crystal piece in a substantially rectangular shape; open portions corresponding to removal regions of the quartz-crystal piece, which surround the quartz-crystal piece regions at predetermined distances; when out of two corner portions on an +X side of the quartz-crystal piece regions, the corner portion on a −Z' side and the corner portion on a +Z' side are called a first corner portion and a second corner portion respectively, a mask portion corresponding to a first dummy region that is formed on a front surface side of the quartz-crystal substrate and extends in an X axis direction from a line along a Z' axis of the first corner portion; a mask portion corresponding to a second dummy region that is formed on a rear surface side of the quartz-crystal substrate and extends in the X axis direction from a line along the Z' axis of the second corner portion; and a mask portion corresponding to a support portion connecting a substantially center portion of the quartz-crystal piece and the residual portion after the quartz-crystal piece is formed;

etching the metal films exposed from the resist masks to form etching masks;

etching the quartz-crystal substrate with an etching solution by using the etching masks to remove quartz-crystals in the removal regions, and forming the quartz-crystal piece while etching in quartz-crystal portions in regions covered with the etching masks on the first dummy region and the second dummy region is delayed; and forming excitation electrodes and lead electrodes on the quartz-crystal piece, and in which as for the first dummy region and the second dummy region, dimensions in a Z' direction are determined in a manner that the quartz-crystal portions at positions corresponding to the dummy regions are removed when the quartz-crystal piece is formed.

Further, in the present invention, when out of two corner portions on a −X side of the quartz-crystal piece regions, the corner portion on the −Z' side and the corner portion on the +Z' side are called a third corner portion and a fourth corner portion respectively, the resist masks may include a mask portion corresponding to a third dummy region that is formed on the front surface side of the quartz-crystal substrate and extends in the X axis direction from a line along the Z' axis of the third corner portion and a mask portion corresponding to a fourth dummy region that is formed on the rear surface side of the quartz-crystal substrate and extends in the X axis direction from a line along the Z' axis of the fourth corner portion, for example. Further, in the present invention, among the first to fourth dummy regions, at least the single dummy region may extend to the residual portion to be connected to the residual portion, for example.

In the present invention, when a quartz-crystal piece is formed, etching masks having dummy regions at positions corresponding to corner portions of the quartz-crystal piece on a +X side where etching proceeds aggressively are formed. The dummy regions are formed in a manner that quartz-crystals of a quartz-crystal substrate at portions under the dummy regions are removed when the quartz-crystal piece is formed. Accordingly, in the present invention, the quartz-crystal piece without chipped portions at corners can be formed in a state where a center portion on one side surface of the quartz-crystal piece is connected to and supported by the quartz-crystal substrate. Thus, the desired quartz-crystal piece can be obtained by etching. Then, by providing support portion regions at places except the dummy regions, there is no need to form connection support portions at positions corresponding to corners of the quartz-crystal piece, and excitation electrodes and lead electrodes can be provided without restraint. Accordingly, effects in which a shape of a casing of a quartz-crystal resonator, positions of electrodes connected to the lead electrodes, a method of connecting of the quartz-crystal resonator, and so on can be set without restraint, the degree of freedom in processes of manufacturing the quartz-crystal resonator can be increased, and the like can be expected.

BRIEF DESCRIPTION OF THE DRAWINGS

FIG. 2(a), FIG. 2(b), and FIG. 2(c) are explanatory views to explain shapes of etching masks in this embodiment;

FIG. 4(a), FIG. 4(b), FIG. 4(c), and FIG. 4(d) are second explanatory views to explain the method of manufacturing the quartz-crystal resonator in this embodiment;

FIG. 5(a), FIG. 5(b), and FIG. 5(c) are third explanatory views to explain the method of manufacturing the quartz-crystal resonator in this embodiment;

FIG. 6(a) and FIG. 6(b) are fourth explanatory views to explain the method of manufacturing the quartz-crystal resonator in this embodiment;

FIG. 9(a), FIG. 9(b), FIG. 9(c), and FIG. 9(d) are seventh explanatory views to explain the method of manufacturing the quartz-crystal resonator in this embodiment;

FIG. 10(a) and FIG. 10(b) are perspective views of the quartz-crystal resonator in this embodiment;

FIG. 11(a) and FIG. 11(b) are explanatory views to explain the quartz-crystal resonator in this embodiment;

FIG. 12(a) and FIG. 12(b) are explanatory views to explain shapes of etching masks in another embodiment in the present invention;

FIG. 13(a) and FIG. 13(b) are explanatory views to explain shapes of conventional etching masks; and FIG. 14(a) and FIG. 14(b) are explanatory views to explain a conventional quartz-crystal resonator element.

DETAILED DESCRIPTION OF THE PREFERRED EMBODIMENT(S)

Figure 1:
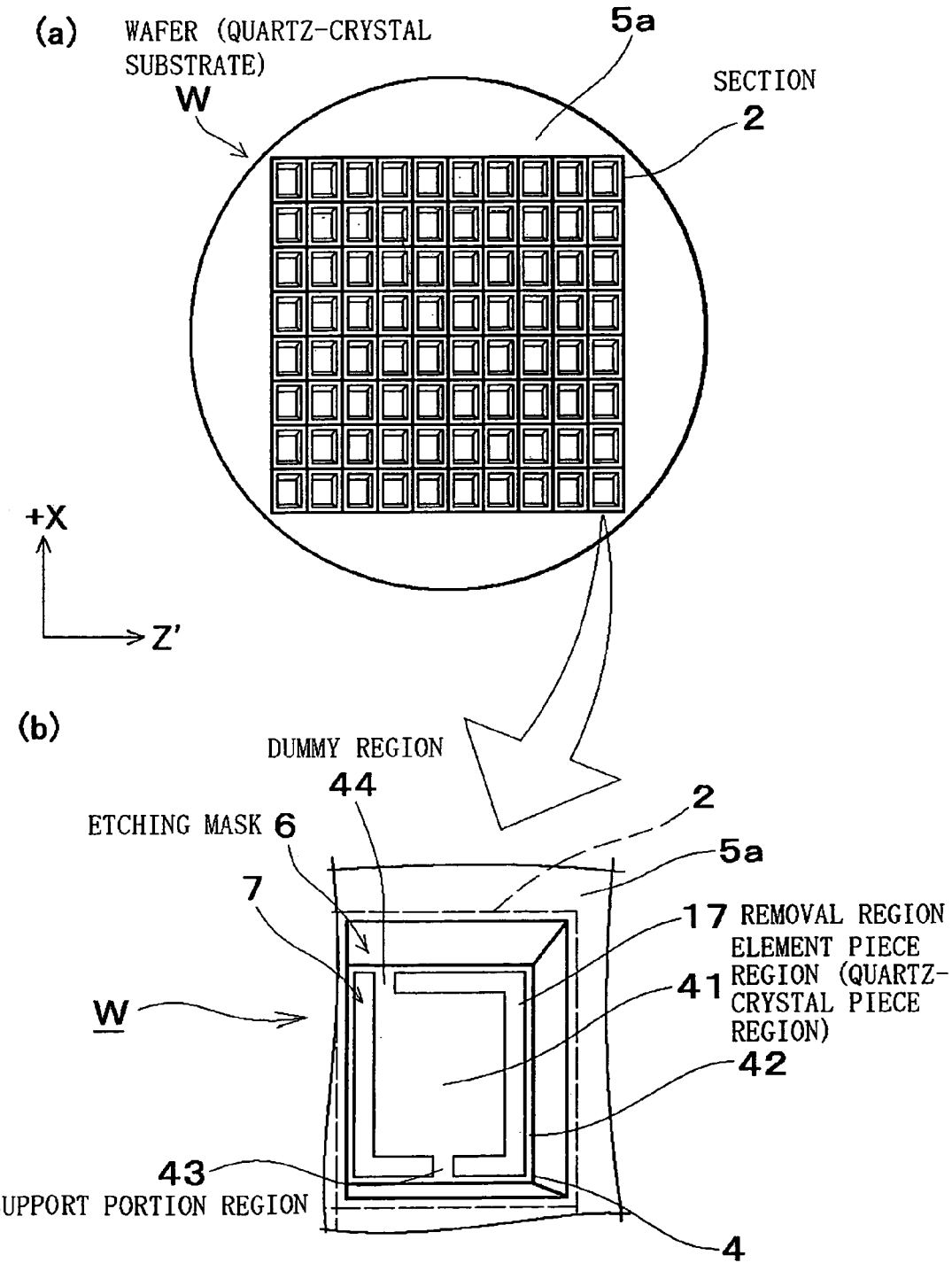
FIG. 1(a) and FIG. 1(b) are schematic plane views of a quartz-crystal wafer W in an embodiment.
Figure 3:
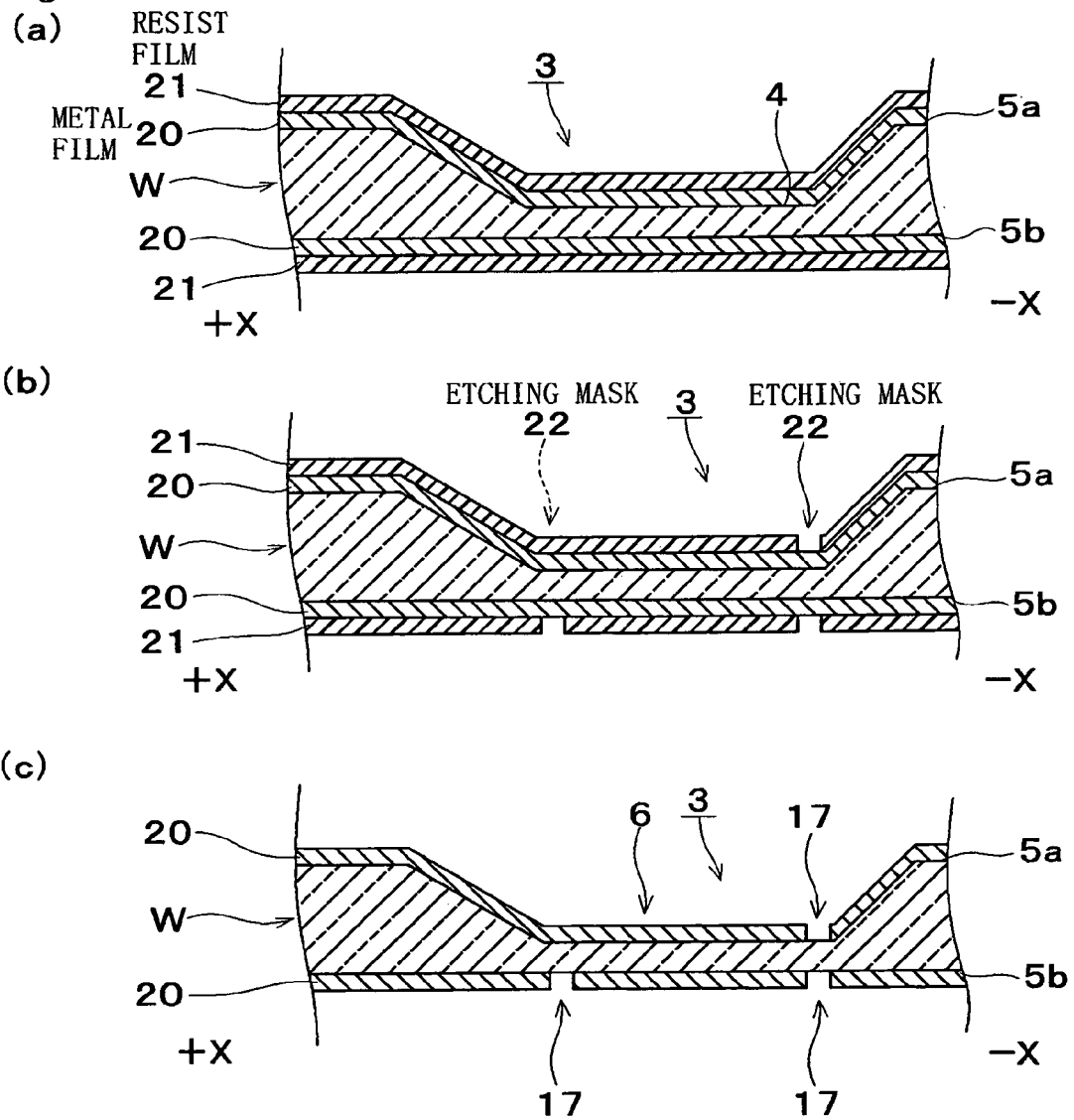
FIG. 3(a), FIG. 3(b), and FIG. 3(c) are first explanatory views to explain a method of manufacturing a quartz-crystal resonator in this embodiment.

A method of manufacturing a quartz-crystal resonator according to the present invention will be explained with reference to FIG. 1(a) and FIG. 1(b) to FIG. 11(a) and FIG. 11(b). A quartz-crystal resonator 1 (refer to FIG. 9(a) to FIG. 9(d)) in an embodiment is formed from an AT cut quartz-crystal wafer W as illustrated in FIG. 1(a), for example. In the wafer W, a plurality of sections 2 for forming the quartz-crystal resonators 1, which are 80 in total constituted by eight columns in an X axis direction in the illustration and ten rows in a Z' axis direction in the illustration, for example, are provided, and the plural quartz-crystal resonators 1 are formed from the single wafer W. In this embodiment, the quartz-crystal wafer W having a thickness of, for example, 300 μm is used, and quartz-crystal pieces 10 having a thickness of, for example, 30 μm are formed from the wafer W to manufacture the quartz-crystal resonators 1. Thus, etching is performed in each of the sections 2 to form concave portions 3, and in each of the sections 2, a thickness between a second front surface 4 (a bottom surface of the concave portion 3) to be a surface for forming the quartz-crystal piece 10 and a rear surface 5b of the wafer W (refer to FIG. 3(a) to FIG. 3(c)) is adjusted to be 30 μm. Then, an etching mask 6 for forming the quartz-crystal piece is formed on the second front surface 4, and the quartz-crystal piece 10 for manufacturing the quartz-crystal resonator 1 is formed on the second front surface 4.

Here, when a thickness direction of the wafer W is set as a Y' axis direction, a second front surface 4 side is set as a +Y' side and a rear surface 5b side is set as a −Y' side. +Y' and −Y' as above indicate a + side and a − side of a Y axis (mechanical axis) of a quartz-crystal respectively when the Y axis is made to correspond to an AT cut quartz-crystal substrate and to rotate to a direction corresponding to a thickness direction of the substrate. Further, Z' and Z" that will be described later indicate a + side and a − side of a Z axis (mechanical axis) of the quartz-crystal respectively when the Z axis is made to correspond to the AT cut quartz-crystal substrate and to rotate to a direction corresponding to a plane direction of the substrate.

The etching mask 6 is formed on the second front surface 4 and the rear surface 5b as illustrated in FIG. 2(a), FIG. 2(b), and FIG. 2(c). These etching masks 6 are formed in a manner that shapes and forming positions of the masks are not matched on the second front surface 4 and the rear surface 5b. The etching mask 6 to be formed on the second front surface 4 side has an element piece region 41 where the quartz-crystal piece 10 is formed at a center thereof as illustrated in FIG. 2(a), and has a frame region 42 at a predetermined interval in a periphery of the element piece region 41. The element piece region 41 and the frame region 42 are connected in a support portion region 43 at a substantially center portion on a −X side in the illustration, and on the Z" side (which is also called a −Z' side being a side opposite to Z' in the illustration) on a +X side in the illustration, the etching mask 6 has a dummy region 44 extending in the X axis direction. The dummy region 44 is formed to connect the element piece region 41 and the frame region 42 similarly to the support portion region 43, and further it is formed in a manner that a position of a side portion thereof on the Z" side corresponds to a first side portion 30 of the element piece region 41 on the Z" side. Then, regions where the wafer W is exposed between the element piece region 41 and the frame region 42 are set as removal regions 17 of the etching mask 6, and when the quartz-crystals in the removal regions 17 are removed, later-described groove portions 7 (refer to FIG. 4(a) to FIG. 4(d), FIG. 5(a) to FIG. 5(c)) are formed.

On the other hand, the etching mask 6 to be formed on the rear surface 5b, as illustrated in FIG. 2(b), has an element piece region 45, a frame region 46, a support portion region 47, and a dummy region 48 similarly to the second front surface 4 side. Unlike the dummy region 44, the dummy region 48 is formed to extend in the X axis direction from a corner on the Z' side on the +X side in the illustration and to connect the element piece region 45 and the frame region 46 as illustrated in FIG. 2(b). Further, the dummy region 48 is formed in a manner that a position of a side portion thereof on the Z' side corresponds to a second side portion 33 of the element piece region 45 on the Z' side. Accordingly, when the etching masks are seen from the Y' axis direction, the dummy region 44 and the dummy region 48 are formed at the both side portions in the Z' axis direction respectively.

Further, the element piece region 45 is formed to protrude toward the Z' side rather than the element piece region 41, and as illustrated in FIG. 2(c), it is formed in a manner that in the thickness direction of the wafer W (the Y' axis direction), a position of the first side portion 30 and a position of a first side portion 32 on the Z" side do not overlap, and a position of a second side portion 31 and a position of the second side portion 33 on the Z' side do not overlap respectively. That is, the etching masks 6 are formed in a manner that the frame region 42 and the frame region 46 overlap in the thickness direction of the wafer W, and the support portion region 43 and the support portion region 47 overlap in the thickness direction of the wafer W. Then, the etching masks 6 are formed in a manner that a portion of the element piece region 41 and a portion of the element piece region 45 do not overlap in the thickness direction of the wafer W, and further the dummy region 44 and the dummy region 48 do not overlap in the thickness direction of the wafer W. Note that FIG. 2(c) schematically illustrates a cross section of the wafer W at positions illustrated by arrows B-B in FIG. 2(a).

Next, processes of forming the quartz-crystal pieces 10 of the quartz-crystal resonators 1 in this embodiment will be explained. In this embodiment, as described previously, in each of the sections 2 in the wafer W, etching is first performed to form the concave portion 3, and the thickness between the second front surface 4 and the rear surface 5b is thinned to be a thickness of the quartz-crystal piece 10 to be formed (refer to FIG. 1(a) and FIG. 1(b)). Next, as illustrated in FIG. 3(a), metal films 20 made of Cr (chromium) and Au (gold) and resist films 21 are each formed on the concave portion 3, a first front surface 5a, and the rear surface 5b, and resist masks 22 matched with the shapes of the etching masks 6 are formed by photolithography. Then, as illustrated in FIG. 3(c), the metal films 20 are etched with a KI (potassium iodide) solution to form the etching masks 6 illustrated in FIG. 2(a) to FIG. 2(c). Note that FIG. 3(a) to FIG. 3(c) schematically illustrate cross sections of the wafer W at positions illustrated by arrows C-C in FIG. 2(a).

Next, the wafer W is immersed in a hydrofluoric acid solution (which will be simply called an etching solution, hereinafter), and the wafer W is etched correspondingly to the shapes of the etching masks 6 to form the quartz-crystal piece 10 in a shape corresponding to the element piece region 41 and the element piece region 45. Etching in the wafer W proceeds as illustrated in FIG. 4(a) to FIG. 4(d) in the Z' axis direction of the etching masks 6. As illustrated in FIG. 4(a), when the etching solution is applied to the wafer W that is not yet etched, as illustrated in FIG. 4(b), on the Z' side, etching proceeds aggressively from the second front surface 4 side, and on the Z" side, etching proceeds aggressively from the rear surface 5b side. Note that FIG. 4(a) to FIG. 4(d) schematically illustrate cross sections of the wafer W at positions illustrated by arrows D-D illustrated in FIG. 2(a).

Thereafter, when etching further proceeds, etching also proceeds in the quartz-crystals at portions under the etching masks 6 by side etching. As illustrated in FIG. 4(c), through groove portions 8 are formed by second front surfaces of the groove portions 7 on the second front surface 4 side and the rear surface 5b side being passed through, and the quartz-crystals at the portions under the etching masks 6 are etched. The quartz-crystal on the rear surface 5b side on the Z' side and the quartz-crystal on the second front surface 4 side on the Z" side, which remain at portions that will be side portions of the quart-crystal piece 10 thereafter, are etched, and a side surface of the quartz-crystal piece 10 in the Z' axis direction is formed (refer to FIG. 4(d)).

Note that the AT cut quartz-crystal has a characteristic that when etching is performed, in the Z' axis direction, side surfaces on sides where etching proceeds aggressively are etched substantially perpendicularly to the Y' axis as illustrated in FIG. 4(a) to FIG. 4(d). Thus, in order to complete the side surfaces of the quartz-crystal piece 10 to be vertical surfaces by using the above characteristic, this embodiment is made in a manner that the element piece region 45 is protruded toward the Z' side rather than the element piece region 41 and the side surfaces of the quartz-crystal piece 10 are formed on the sides where etching proceeds aggressively. Further, there is sometimes a case that chippings of the quartz-crystals by side etching are generated in the side surface in the Z' axis direction, but the chippings are small enough not to affect a characteristic of the quartz-crystal resonator 1, so that the chippings are not illustrated in this embodiment.

On the other hand, as for cross sections of the etching masks 6 in the X axis direction, etching in the wafer W proceeds as illustrated in FIG. 5(a) to FIG. 5(c) to FIG. 8. When the etching solution is applied to the wafer W that is not yet etched as illustrated in FIG. 5(a), as illustrated in FIG. 5(b), etching is started and the quartz-crystals positioned correspondingly to the groove portions 7 are removed. Note that similarly to FIG. 3(a) to FIG. 3(c), FIG. 5(a) to FIG. 5(c) schematically illustrate the cross sections of the wafer W at the positions illustrated by the arrows C-C in FIG. 2(a).

As illustrated in FIG. 5(b), at the corner on the Z" side on the +X side, penetration of the etching solution is obstructed by the dummy region 44 is formed on the second front surface 4, and the start of etching is delayed by the dummy region 44 compared to that at positions of the other groove portions 7. Thus, even when etching starts to proceed in other regions of the groove portions 7, etching does not proceed in the quartz-crystal at the portion under the dummy region 44. When etching in the groove portions 7 proceeds as illustrated in FIG. 5(c) thereafter, side portions of the quartz-crystal at the portion under the dummy region 44 are exposed, thereby being exposed to the etching solution penetrated into the groove portion 7. Thus, in the quartz-crystal at the portion under the dummy region 44, etching is started from the side portions. Accordingly, etching in the quartz-crystal at the portion under the dummy region 44 is started late compared to that at the other positions of the groove portions 7.

Figure 7:
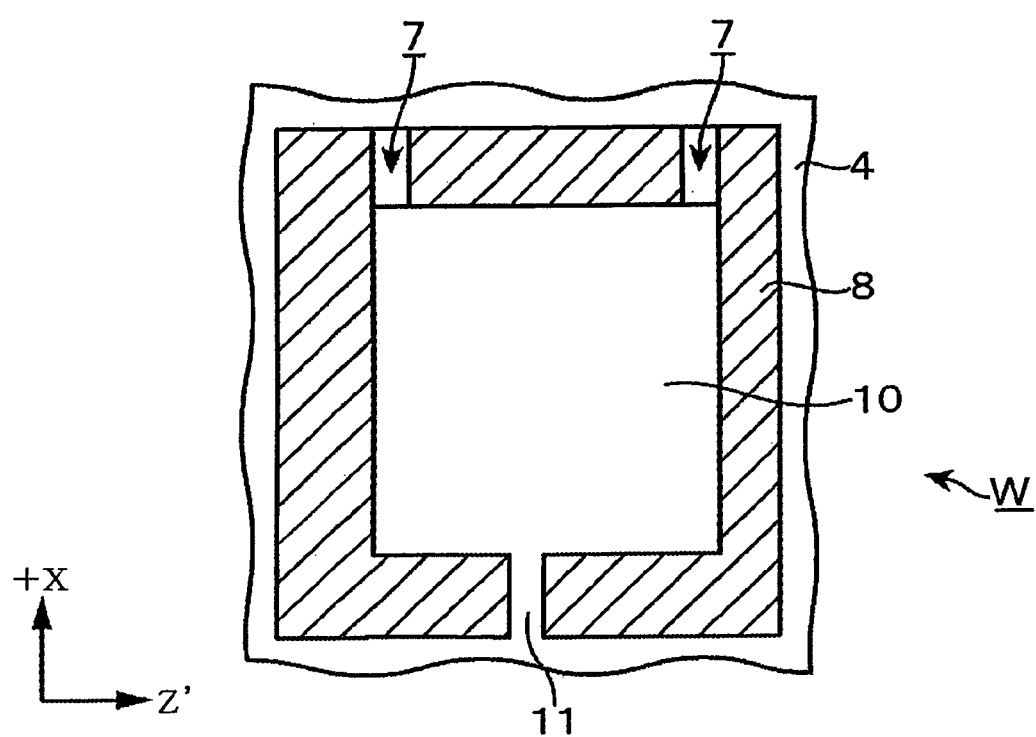
FIG. 7 is a fifth explanatory view to explain the method of manufacturing the quartz-crystal resonator in this embodiment.

When etching proceeds thereafter, as illustrated in FIG. 6(a), etching proceeds in the quartz-crystals at the portions under the etching masks 6 by side etching, and the through groove portion 8 is formed by second front surfaces of the groove portions 7 on the second front surface 4 side and the rear surface 5b side on the −X side being passed through. At this time, on the +X side, etching on the second front surface 4 side is started late by the dummy region 44, so that the wafer W is brought into a state where a second front surface of the groove portion 7 on the second front surface 4 side and a second front surface of the groove portion 7 on the rear surface 5b side are not passed through. Then, as illustrated in FIG. 7, the wafer W is brought into a state where the second front surfaces of all of the groove portions 7 except the groove portions 7 positioned correspondingly to the dummy region 44 and the dummy region 48 are passed through, and thereby the through groove portions 8 are formed. Note that in FIG. 7, the illustrations of the etching masks 6 are omitted.

When etching further proceeds from the above state, as illustrated in FIG. 6(b), the through groove portion 8 is formed by the second front surfaces of the groove portions 7 on the second front surface 4 side and the rear surface 5b side on the +X side being passed through, and the quartz-crystals that remain at portions to be side portions of the quartz-crystal piece 10 are removed by etching. At this time, the quartz-crystal at the position under the dummy region 44 is brought into a state where it is all etched to be removed.

Note that at a corner on the Z' side on the +X side, the dummy region 48 is formed on the rear surface 5b, and on the Z' side on the +X side, the direction in which etching proceeds aggressively is opposite to that on the Z" side, so that proceeding processes of etching on the Z' side on the +X side are made opposite to proceeding processes on the Z" side on the +X side illustrated in FIG. 5(a) to FIG. 5(c) and FIG. 6(a) and FIG. 6(b). Then, delay is caused in etching in the quartz-crystal at a portion under the dummy region 48.

Figure 8:
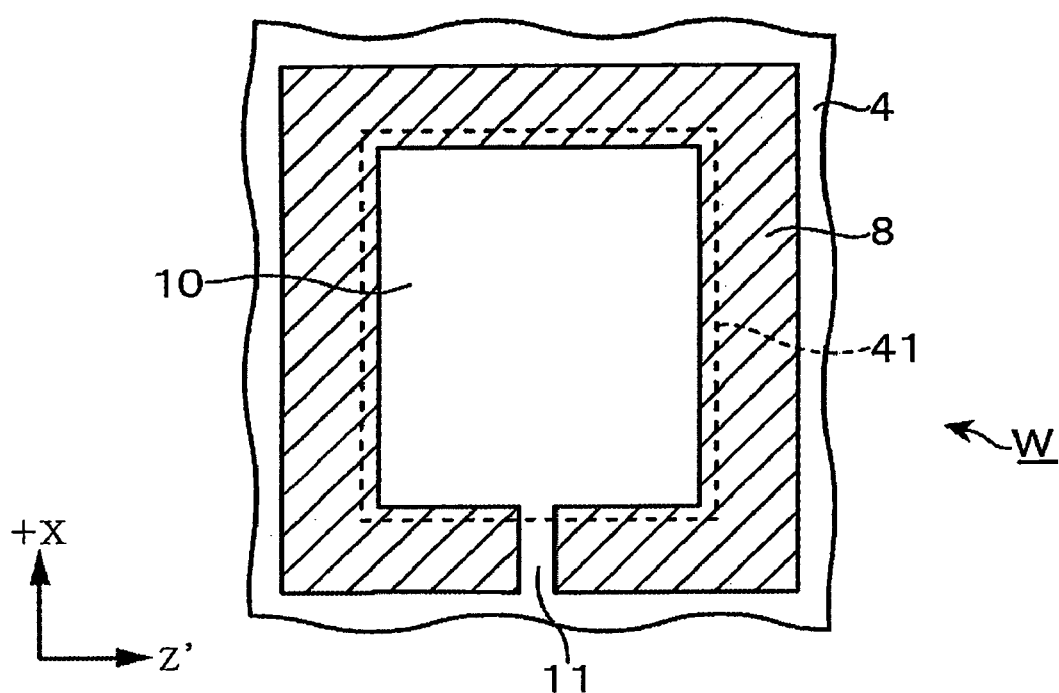
FIG. 8 is a sixth explanatory view to explain the method of manufacturing the quartz-crystal resonator in this embodiment.

In this manner, in the wafer W to which the etching solution is applied, etching proceeds in the Z' axis direction and the X axis direction as described above and an outline of the quartz-crystal piece 10 is formed as illustrated in FIG. 8. Then, the quartz-crystal piece 10, as illustrated in FIG. 9(a), is brought into a state where it is connected to and supported by the wafer W at a portion under the frame region 42 by a connection support portion 11. Note that since the quartz-crystals on rear surfaces of the element piece regions 41, 45 are side etched as described previously, widths of the quartz-crystal piece 10 to be formed in the X axis direction and the Z' axis direction are made slightly small compared to widths of the element piece regions 41, 45 (refer to FIG. 6(b)) as illustrated in FIG. 8. Further, the etching in the Z' axis direction that is explained in FIG. 4(a) to FIG. 4(d) and the etching in the X axis direction that is explained in FIG. 5(a) to FIG. 5(c) and FIG. 6(a) and FIG. 6(b) are performed simultaneously, and FIG. 4(a) corresponds to FIG. 5(a), FIG. 4(b) corresponds to FIG. 5(b) and FIG. 5(c), FIG. 4(c) corresponds to FIG. 6(a), and FIG. 4(d) corresponds to FIG. 6(b) respectively in a time-series order.

In a conventional quartz-crystal piece 110 (refer to FIG. 14(a) and FIG. 14(b)), etching proceeds aggressively on a +X side in an X axis direction due to an anisotropy of an AT cut quartz-crystal as described previously, and in particular at positions corresponding to corners of the quartz-crystal piece 110, etching is performed from a Z' axis direction as well. Thus, at the corner on a Z" side, etching proceeds aggressively from a front surface 15a side, and at the corner on a Z' side, etching proceeds aggressively from a rear surface 15b side, resulting that chipped portions S1 are formed at the corners.

On the other hand, in the above-described embodiment, in the quartz-crystal piece 10, the dummy region 44 connecting the element piece region 41 and the frame region 42 and the dummy region 48 connecting the element piece region 45 and the frame region 46 are formed respectively at the positions where etching proceeds aggressively, namely at positions corresponding to the positions where the chipped portions S1 are formed conventionally. Thus, in the processes of forming the quartz-crystal piece 10 in this embodiment, etching does not proceed in the quartz-crystals positioned correspondingly to the portions under these dummy regions 44, 48 from the +X side, and the side portions of the quartz-crystals at the portions under the dummy regions 44, 48 are first etched, and etching from the Z' axis direction is started with the etching solution penetrated into the etched groove portions 7. Consequently, at the corner on the Z' side on the +X side, delay is caused in the start of etching from the second front surface 4 side, and at the corner on the Z" side, delay is caused in the start of etching from the rear surface 5b side.

As described above, start times of etching are delayed by the dummy regions 44, 48, and times taken for etching are made short compared to those in the regions of the other groove portions 7, and therefore etching amounts of the quartz-crystals are reduced in the regions corresponding to the dummy regions 44, 48. Thus, in this embodiment, it is possible to prevent chipped portions S1 from being formed at the corners of the quartz-crystal piece 10 by reducing the etching amounts at the positions corresponding to these dummy regions 44, 48. Accordingly, in the processes of forming the quartz-crystal piece 10 in this embodiment, the desired quartz-crystal piece 10 corresponding to the sizes of the etching masks 6 can be obtained. By manufacturing the quartz-crystal resonator 1 from the quartz-crystal piece 10 as will be described later, it is possible to manufacture the quartz-crystal resonator 1 having a favorable characteristic, and it is further possible to manufacture an electronic component provided with the quartz-crystal resonator 1, having a favorable characteristic, and used as a reference source of frequency and a reference source of time.

Further, this embodiment is made in a manner that the support portion regions 43, 47 that are to be a forming region of the connection support portion 11 and the dummy regions 44, 48 are separated, and patterns of the etching masks 6 are not formed in regions facing to the dummy regions 44, 48 in the thickness direction between the second front surface 4 and the rear surface 5b of the wafer W. Then, sizes of the dummy regions 44, 48 are formed to be sizes of which the quartz-crystals at the positions under the dummy regions 44, 48 are all etched to be removed when the outline of the quartz-crystal piece 10 is formed. Accordingly, this embodiment is brought into a state where only the connection support portion 11 connects and supports the substantially center portion of the quartz-crystal piece 10 and the wafer W when the quartz-crystal piece 10 is formed, and therefore there is no case that the quartz-crystals at the portions under the dummy regions 44, 48 remain to be obstacles to forming respective electrodes thereafter. Thus, it makes it possible to provide respective electrodes at the corners of the quartz-crystal piece 10, which correspond to the dummy regions 44, 48, without restraint, and it makes it possible to improve the degree of freedom of an arrangement of the electrodes. Thus, effects in which a shape of a later-described outer housing 34 for the quartz-crystal resonator 1, positions of mounting electrodes 35 connected to lead electrodes 13, a method of mounting the quartz-crystal resonator 1 in the outer housing 34, and so on can be set without restraint, the degree of freedom in processes of manufacturing an electronic component provided with the quartz-crystal resonator 1 can be increased, and like can be expected.

Next, processes of manufacturing the quartz-crystal resonator 1 from the quartz-crystal piece 10 will be explained. First, a metal film 23 and a resist film 24 are formed on the whole surface of the quartz-crystal piece 10 that is formed (refer to FIG. 9(a)), and by photolithography and etching with the KI solution, a mask pattern corresponding to shapes of excitation electrodes 12 and the lead electrodes 13 in the quartz-crystal resonator 1 is formed (refer to FIG. 9(b)). Then, as illustrated in FIG. 9(c), when the metal film 23 is etched to remove the resist film 24, the excitation electrodes 12 and the lead electrodes 13 are formed. Next, as illustrated in FIG. 9(d), when the resist film 24 is removed and the connection support portion 11 is cut by laser dicing, the quartz-crystal resonator 1 being a piece is formed. The quartz-crystal resonator 1 is formed in a manner that as illustrated in FIG. 10(a) and FIG. 10(b), the excitation electrodes 12 are formed on the front surfaces of the quartz-crystal piece 10, which face to each other, and the lead electrodes 13 connected to the respective excitation electrodes 12 are formed to cover a side surface common to each other all along the front surface to the rear surface, where the connected excitation electrodes 12 are formed. Note that in this embodiment, chipped portions S by side etching are formed at the corners on the -X side in the X axis direction. This is because etching proceeds from the Z' axis direction and the X axis direction at the portions corresponding to the corners of the quartz-crystal piece 10. However, as descried previously, proceeding speeds of the etching on the -X side are extremely slow compared to those on the +X side, and the chipped portions S to be formed at the corners are small. Further, since the lead electrodes 13 are formed on the -X side, the chipped portions S do not affect the characteristic of the quartz-crystal resonator 1 significantly. Further, similarly to FIG. 3(a) to FIG. 3(c), FIG. 9(a) to FIG. 9(d) schematically illustrate the cross sections of the wafer W at the positions illustrated by the arrows C-C.

Next, an electronic component in which the quartz-crystal resonator 1 is assembled will be explained with reference to FIG. 11(a) and FIG. 11(b). As illustrated in FIG. 11(a) and FIG. 11(b), the electronic component is formed by sealing the quartz-crystal resonator 1 in the outer housing 34. In the electronic component, the quartz-crystal resonator 1 is fixed in a manner that the lead electrodes 13 are electrically connected to a pair of the mounting electrodes 35 provided in the outer housing 34 with a conductive adhesive 36. Then, an outer electrode 37 at a portion under the outer housing 34, which is connected to the mounting electrodes 35 via wirings, is connected to electrodes of other electronic components such as an oscillator, thereby enabling the quartz-crystal resonator 1 inside the outer housing 34 and the other components to be connected electrically.

Another Embodiment

Further, the method of manufacturing the quartz-crystal resonator of the present invention may be as follows. As illustrated in FIG. 12(a) and FIG. 12(b), for example, an embodiment may be made in a manner that etching masks 16 having second dummy regions 50, 51 on a -X side in an X axis direction are formed and a wafer W is etched correspondingly to shapes of the etching masks 16, and a quartz-crystal piece 10 in a shape corresponding to an element piece region 41 and an element piece region 45 is formed. Note that in this embodiment, except a point on which the etching masks 16 have the second dummy regions 50, 51, the etching masks 16 have the same shapes as those of the etching masks 6 in the first embodiment, and processes of manufacturing a quartz-crystal resonator are also made to be processes similar to those in the first embodiment. Thus, in this embodiment, only the things related to the second dummy regions 50, 51 will be explained.

The second dummy region 50 is formed at a corner on a Z" side on the -X side in the X axis direction to extend in the X axis direction and connect the element piece region 41 and a frame region 42. Further, the second dummy region 51 is formed at a corner on a Z' side on the -X side in the X axis direction to extend in the X axis direction and connect the element piece region 45 and a frame region 46. That is, on the Z" side, a dummy region 44 and the second dummy region 50 are formed on a second front surface 4 respectively, and on the Z' side, the second dummy region 51 is formed on a rear surface 5b. Widths of the second dummy regions 50, 51 in a Z' axis direction are made thin compared to those of the dummy regions 44, 48. This is because proceeding speeds of etching at corners on the -X side of the quartz-crystal piece 10 are slow compared to those at corners on the +X side, and as illustrated in FIG. 14(a) and FIG. 14(b), sizes of chipped portions S to be formed are also small compared to those of chipped portions S1.

By forming the second dummy regions 50, 51, in this embodiment, start times of etching at the corners on the -X side are delayed and times taken for etching are made short compared to those in regions of other groove portions 7, and etching amounts of quartz-crystals in regions corresponding to the second dummy regions 50, 51 are reduced. Accordingly, in this embodiment, it is possible not only to prevent the chipped portions S1 (refer to FIG. 14(a) and FIG. 14(b)) by side etching from being formed at the corners on the +X side but also to prevent the chipped portions S (refer to FIG. 10(a) and FIG. 10(b)) by side etching from being formed at the corners on the -X side, and the quartz-crystal resonator 1 having a favorable characteristic can be manufactured. Then, an electric component provided with the quartz-crystal resonator 1 and having a favorable characteristic can be manufactured.

Note that in the above-described respective embodiments, the connection support portion 11 connects and supports the wafer W and the quartz-crystal piece 10 at the substantially center portion on the −X side of the quartz-crystal piece 10, but the embodiments of the present invention are not limited to the above, and a connection support portion may connect and support the wafer and the quartz-crystal piece at a substantially center portion on the +X side, for example. However, when the connection support portion is formed on the +X side, the connection support portion is required to be formed not to interfere with the dummy regions 44, 48 as is a connection support portion 11 in the second embodiment. Further, in the respective embodiments, the dummy regions 44, 48 and the second dummy regions 50, 51 extend in the X axis direction from the element piece regions 41, 45 and connect to the frame regions 42, 46, but the embodiments of the present invention are not limited to the above. Unless chipped portions are formed at corners of the quartz-crystal piece, the embodiments of the present invention may be made in a manner that dummy regions are not connected to frame regions and an etching solution is penetrated from an X axis side of the dummy regions.

Further, in the respective embodiments, the AT cut quartz-crystal wafer W is used, but the embodiments of the present invention are not limited to the above, and if the embodiments of the present invention are a manufacturing method in which a quartz-crystal piece is formed from a quartz-crystal having an anisotropy by etching to thereby manufacture a quartz-crystal resonator, the embodiments can be applied. For example, on a quartz-crystal in which etching on a Z' side on a Z' axis proceeds aggressively, an etching mask having a dummy region on the Z' side may be formed to thereby form a quartz-crystal piece. Further as for positions where the dummy regions are formed, the embodiments of the present invention are not limited to the dummy regions formed at the positions that are surely paired by one for each on the front surface side and the rear surface side, and an embodiment in which, for example, dummy regions are formed at two positions on a front surface side at portions to be side etched and a dummy region is not formed on a rear surface side may be applied.

What is claimed is:

1. A method of manufacturing a quartz-crystal resonator, which includes using an AT cut quartz-crystal substrate to obtain a quartz-crystal piece in a substantially rectangular shape by etching in a state where the quartz-crystal piece is supported at a residual portion of the quartz-crystal substrate, the method comprising:

forming metal films and resist films on a front surface being a surface on a +Y' side and a rear surface of the quartz-crystal substrate:

performing exposure and development processes for the resist films and forming resist masks that include: mask portions corresponding to quartz-crystal piece regions to obtain the quartz-crystal piece in a substantially rectangular shape; open portions corresponding to removal regions of the quartz-crystal piece, which surround the quartz-crystal piece regions at predetermined distances; when out of two corner portions on an +X side of the quartz-crystal piece regions, the corner portion on a −Z' side and the corner portion on a +Z' side are called a first corner portion and a second corner portion respectively, a mask portion corresponding to a first dummy region that is formed on a front surface side of the quartz-crystal substrate and extends in an X axis direction from a line along Z' axis of the first corner portion; a mask portion corresponding to a second dummy region that is formed on a rear surface side of the quartz-crystal substrate and extends in the X axis direction from a line along the Z' axis of the second corner portion; and a mask portion corresponding to a support portion connecting a substantially center portion of the quartz-crystal piece and the residual portion after the quartz-crystal piece is formed;

etching the metal films exposed from the resist masks to form etching masks;

etching the quartz-crystal substrate with an etching solution by using the etching masks to remove quartz-crystals in the removal regions, and forming the quartz-crystal piece while etching in quartz-crystal portions in regions covered with the etching masks on the first dummy region and the second dummy region is delayed; and forming excitation electrodes and lead electrodes on the quartz-crystal piece, and wherein as for the first dummy region and the second dummy region, dimensions in a Z' direction are determined in a manner that the quartz-crystal portions at positions corresponding to the dummy regions are removed when the quartz-crystal piece is formed.

2. The method of manufacturing the quartz-crystal resonator according to claim 1, wherein when out of two corner portions on a −X side of the quartz-crystal piece regions, the corner portion on the −Z' side and the corner portion on the +Z' side are called a third corner portion and a fourth corner portion respectively, the resist masks include a mask portion corresponding to a third dummy region that is formed on the front surface side of the quartz-crystal substrate and extends in the X axis direction from a line along the Z' axis of the third corner portion and a mask portion corresponding to a fourth dummy region that is formed on the rear surface side of the quartz-crystal substrate and extends in the X axis direction from a line along the Z' axis of the fourth corner portion.

3. The method of manufacturing the quartz-crystal resonator according to claim 1, wherein among the first to fourth dummy regions, at least the single dummy region extends to the residual portion to be connected to the residual portion.

4. The method of manufacturing the quartz-crystal resonator according to claim 2, wherein among the first to fourth dummy regions, at least the single dummy region extends to the residual portion to be connected to the residual portion.

* * * * *